United States Patent
Degrenne et al.

(10) Patent No.: US 10,827,619 B2
(45) Date of Patent: Nov. 3, 2020

(54) PRINTED CIRCUIT BOARD AND METHOD FOR MANUFACTURING PRINTED CIRCUIT BOARD

(71) Applicant: MITSUBISHI ELECTRIC CORPORATION, Tokyo (JP)

(72) Inventors: Nicolas Degrenne, Rennes (FR); Stefan Mollov, Rennes (FR)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/461,896

(22) PCT Filed: Dec. 7, 2017

(86) PCT No.: PCT/JP2017/044802
§ 371 (c)(1),
(2) Date: May 17, 2019

(87) PCT Pub. No.: WO2018/131374
PCT Pub. Date: Jul. 19, 2018

(65) Prior Publication Data
US 2019/0320534 A1    Oct. 17, 2019

(30) Foreign Application Priority Data
Jan. 11, 2017    (EP) .................................... 17151014

(51) Int. Cl.
*H05K 1/18*      (2006.01)
*H01L 23/055*    (2006.01)
(Continued)

(52) U.S. Cl.
CPC .......... *H05K 1/185* (2013.01); *H01L 23/055* (2013.01); *H01L 23/22* (2013.01); *H01L 23/24* (2013.01);
(Continued)

(58) Field of Classification Search
CPC ...... H05K 1/185; H05K 1/145; H05K 3/4697; H05K 1/0206; H05K 2201/0162; H05K 2201/026; H05K 2201/10166; H05K 2203/0307; H05K 3/325; H05K 3/366; H01L 23/055; H01L 23/22; H01L 23/24; H01L 23/49811; H01L 23/49833; H01L 24/33; H01L 2224/33; H01L 2924/00; H01L 24/06; H01L 24/32;
(Continued)

(56) References Cited

U.S. PATENT DOCUMENTS

2001/0043135 A1*  11/2001  Yamada ............. H01F 27/2804
                                                        336/184
2003/0015778 A1    1/2003  Soyano et al.
(Continued)

FOREIGN PATENT DOCUMENTS

EP        2 871 675 A1    5/2015

*Primary Examiner* — Yuriy Semenenko
(74) *Attorney, Agent, or Firm* — Birch, Stewart, Kolasch & Birch, LLP

(57) ABSTRACT

The present invention relates to a printed circuit board embedding a power die wherein interconnections between the power die and the printed circuit board are composed of micro/nano wires, the printed circuit board comprising a cavity wherein the power die is placed, and wherein the cavity is further filled with a dielectric fluid.

13 Claims, 10 Drawing Sheets

(51) Int. Cl.
*H01L 23/22* (2006.01)
*H01L 23/24* (2006.01)
*H01L 23/498* (2006.01)
*H01L 23/00* (2006.01)
*H05K 1/14* (2006.01)
*H05K 3/46* (2006.01)
*H05K 1/02* (2006.01)

(52) U.S. Cl.
CPC .. *H01L 23/49811* (2013.01); *H01L 23/49833* (2013.01); *H01L 24/33* (2013.01); *H05K 1/145* (2013.01); *H05K 3/4697* (2013.01); *H01L 2224/33* (2013.01); *H01L 2924/00* (2013.01); *H05K 1/0206* (2013.01); *H05K 2201/0162* (2013.01); *H05K 2201/026* (2013.01); *H05K 2201/10166* (2013.01); *H05K 2203/0307* (2013.01)

(58) Field of Classification Search
CPC ... H01L 2224/3303; H01L 2924/15153; H01L 2224/0603; H01L 2224/32225; H01L 24/29; H01L 2224/29499; H01L 2224/29291; H01L 2224/29347; H01L 2224/29294; H01L 2224/33181; H01L 2924/13091; H01L 24/90; H01L 23/48
See application file for complete search history.

(56) References Cited

U.S. PATENT DOCUMENTS

| | | | |
|---|---|---|---|
| 2004/0233649 A1* | 11/2004 | Honlein | B82Y 10/00 361/760 |
| 2007/0267735 A1* | 11/2007 | Awano | H01L 23/49877 257/692 |
| 2010/0013085 A1 | 1/2010 | Oi et al. | |
| 2012/0029343 A1* | 2/2012 | Wasson | H01F 41/041 600/424 |

* cited by examiner

PRINTED CIRCUIT BOARD AND METHOD FOR MANUFACTURING PRINTED CIRCUIT BOARD

TECHNICAL FIELD

The present invention relates generally to a printed circuit board embedding a power die and a method for manufacturing said printed circuit board embedding the power die.

BACKGROUND ART

Power die embedding in Printed Circuit Boards (PCBs) is entering the market because it is a low-cost, low-inductance, low electro magnetic interference, and efficiently cooled technology compared to a more conventional power die assembly on a ceramic substrate. However, one remaining issue is the reliability of the interconnections between the power die and the copper pads of the printed circuit boards.

Classically, the interconnections are either performed using soldering, sintering, direct copper deposition or using conductive adhesives.

When the assembly is subject to thermo-mechanical stress like for example due to coefficient of thermal expansion mismatches and thermal gradient, the interconnection may be damaged, leading ultimately to the failure of the power module.

Soft interconnection composed of micro/nano copper wires are proposed in order to overcome aforementioned problems. Nano wires have a high length compared to their diameter and are sufficiently flexible to deform at low strain and stress. They have relatively high density, forming a nano-wire forest, in order to effectively transfer current and heat.

Thus, the mechanical displacements due to thermal effects between the die and the printed circuit board are absorbed by the nano wires without damaging them.

SUMMARY OF INVENTION

Technical Problem

However, nano wires may suffer adhesion/conglomeration/oxidation with the combined action of heat, current, and pressure.

Such a conglomeration results in a hardening/welding of the nano-wire forrest and then the interconnection looses its flexibility.

The present invention aims to allow a decrease of the thermal resistance between the power die and the printed circuit board, an increase of the thermal capacitance, prevent oxidation of the nano wires and prevent conglomeration of the nano wires together due to the joint action of heat and current.

Solution to Problem

To that end, the present invention concerns a printed circuit board embedding a power die wherein interconnections between the power die and the printed circuit board are composed of micro/nano wires, the printed circuit board comprising a cavity wherein the power die is placed, characterized in that the cavity is further filled with a dielectric fluid.

The present invention concerns also a method for manufacturing a printed circuit board embedding a power die wherein interconnections between the power die and the printed circuit board are composed of micro/nano wires, the printed circuit board comprising a cavity wherein the power die is placed, characterized in that the method comprises the step of filling the cavity with a dielectric fluid.

Thus, the micro/nano wires are protected from adhesion, conglomeration, oxidation and isolation is enhanced between different electrical potentials such as gate-drain, source-drain or gate-source in the case of a MOSFET.

According to a particular feature, the dielectric fluid is an isolating silicone gel or grease or a dielectric oil.

Thus, the system can use low-cost and reliable dielectric fluids.

According to a particular feature, the dielectric fluid has a low viscosity during cavity filling to allow the fluid to fill properly the volume of the cavity and between the nano wires.

Thus, the entire remaining volume of the cavity is filled with the dielectric fluid, and the micro/nano wires are better protected from adhesion, conglomeration, oxidation and isolation is enhanced between different electrical potentials such as gate-drain, source-drain or gate-source in the case of a MOSFET.

According to a particular feature, the dielectric fluid is a two-phase material.

Thus, the transition energy is used to stabilize the temperature during surge currents and thus increases the robustness of the device.

According to a particular feature, the printed circuit board further comprises at least one other cavity for enabling the dielectric fluid to shrink in and out of the at least one other cavity.

Thus, the pressure variations in the first cavity can be reduced.

According to a particular feature, the printed circuit board further comprises holes that enable the filling of the dielectric fluid within the cavity and the holes are filled up with a resin after the filling of the dielectric fluid within the cavity.

Thus, the filling of the cavity is realized after the assembly of the printed circuit board embedding a power die and more standard processes can be used.

According to a particular feature, the printed circuit board further comprises flexible membranes that deform when the fluid expands or shrinks with temperature and/or phase change of the fluid.

Thus the pressure variations in the first cavity can be reduced.

According to a particular feature, the printed circuit board further comprises holes that enable the filling of the dielectric fluid within the cavity and the holes are closed with flexible membranes after the filling of the dielectric fluid within the cavity.

Thus, the membranes also serve as holes and the fabrication process is simplified.

The characteristics of the invention will emerge more clearly from a reading of the following description of example embodiments, the said description being produced with reference to the accompanying drawings.

DESCRIPTION OF EMBODIMENTS

Figure 1A:
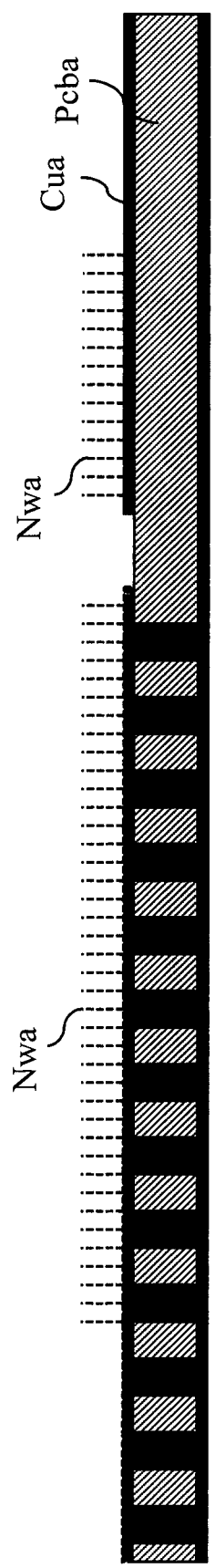
FIG. 1a represents a first step of a manufacturing of a first part of a printed circuit board that is intended to embed a power die according to the present invention.

FIG. 1a represents a first step of the manufacturing of a first part of a printed circuit board that is intended to embed a power die according to the present invention.

The first part of the printed circuit board that is intended to embed a power die according to the present invention is composed of a printed circuit board Pcba that is composed of FR4 material and copper layers Cua.

Nano wires Nwa are disposed on parts of the copper layer Cua. In the example of FIG. 1a, the nano wires are created on the copper pads of the first part of the printed circuit board.

Alternatively, the nano wires are created on the power die itself. For example, nano wires are formed by attaching/growing a porous alumina layer to the copper surface, copper electroplating, and selectively etching the layer.

The formed nano wires are typically wires with length in the order of 10 μm and diameter in the order of 100 nm. The ratio between length and diameter is typically higher than 10. The nano wires are sufficiently numerous, for example at least one million per cm2 and may cover more than 50% of the treated surface to provide a high cumulative cross-section. The nano wires are processed in order to obtain consistent heights, thus facilitating a homogeneous contact with the surface of the power die. This can be done for example by a polishing step prior to porous layer etching.

In order to prevent adhesion of the wires together due to the joint action of heat and current, a step of surface coating may be added.

For example, a coating layer of non-bondable material may be deposited on the external surface of the nano wires by deposition techniques such as chemical vapor deposition, electroless of electrolytic deposition, or a combination of above mentioned techniques.

Figure 1B:
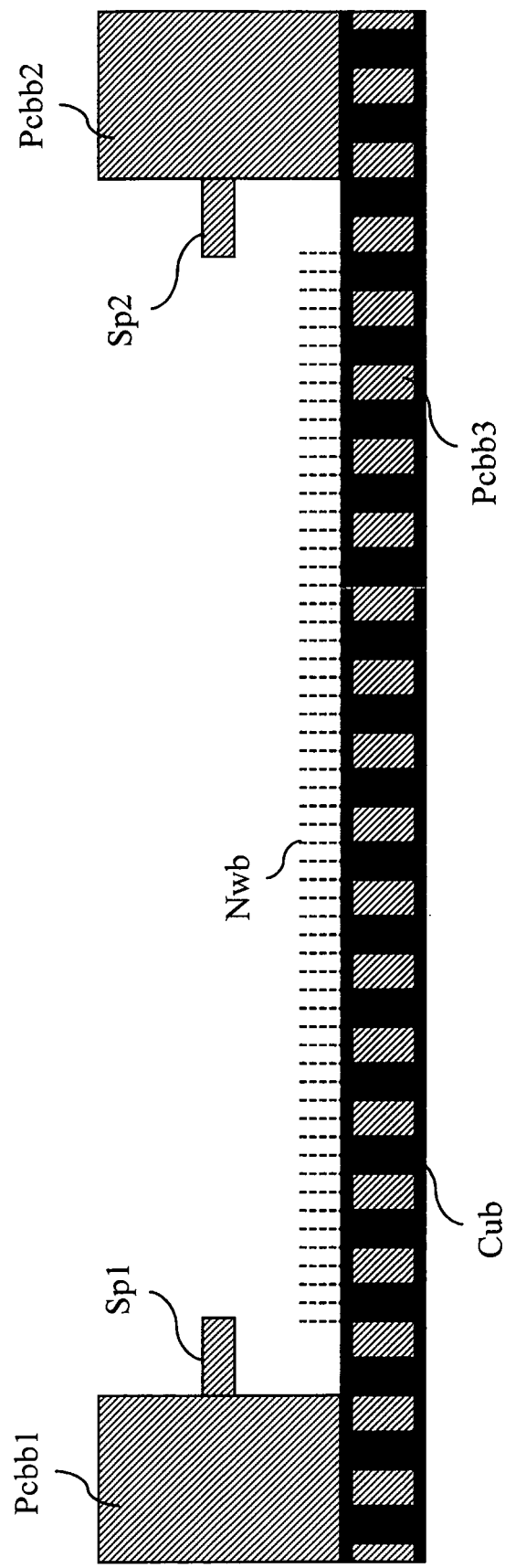
FIG. 1b represents a first step of the manufacturing of a second part of a printed circuit board that is intended to embed a power die according to the present invention.

FIG. 1b represents a first step of the manufacturing of a second part of a printed circuit board that is intended to embed a power die according to the present invention.

The second part of the printed circuit board that is intended to embed a power die according to the present invention is composed of printed circuit boards Pcbb1 to Pcbb3 that are composed of FR4 material and the printed circuit boards Pcbb3 is further composed of copper layers Cub.

Nano wires Nwb are disposed on parts of the copper layer Cub. In the example of FIG. 1b, the nano wires are created on the copper pads of the second part of the printed circuit board.

Alternatively, the nano wires are created on the power die itself. For example, nano wires are formed by attaching/growing a porous alumina layer to the copper surface, copper electroplating, and selectively etching the layer.

The formed nano wires are typically wires with length in the order of 10 μm and diameter in the order of 100 nm. The ratio between length and diameter is typically higher than 10. The nano wires are sufficiently numerous, for example at least one million per cm2 and may cover more than 50% of the treated surface to provide a high cumulative cross-section. The nano wires are processed in order to obtain constant heights, thus facilitating a homogeneous contact with the surface of the power die. This can be done for example by a polishing step prior to porous layer etching.

In order to prevent adhesion of the nano wires together due to the joint action of heat and current, a step of surface coating may be added.

For example, a coating layer of non-bondable material may be deposited on the external surface of the nano wires by deposition techniques such as chemical vapor deposition, electroless of electrolytic deposition, or a combination of above mentioned techniques.

The printed circuit board Pcbb1 comprises a spacer Sp1 that is intended to place the power die at a right position.

The printed circuit board Pcbb2 comprises a spacer Sp2 that is intended to place the power die at the right position.

Figure 2:
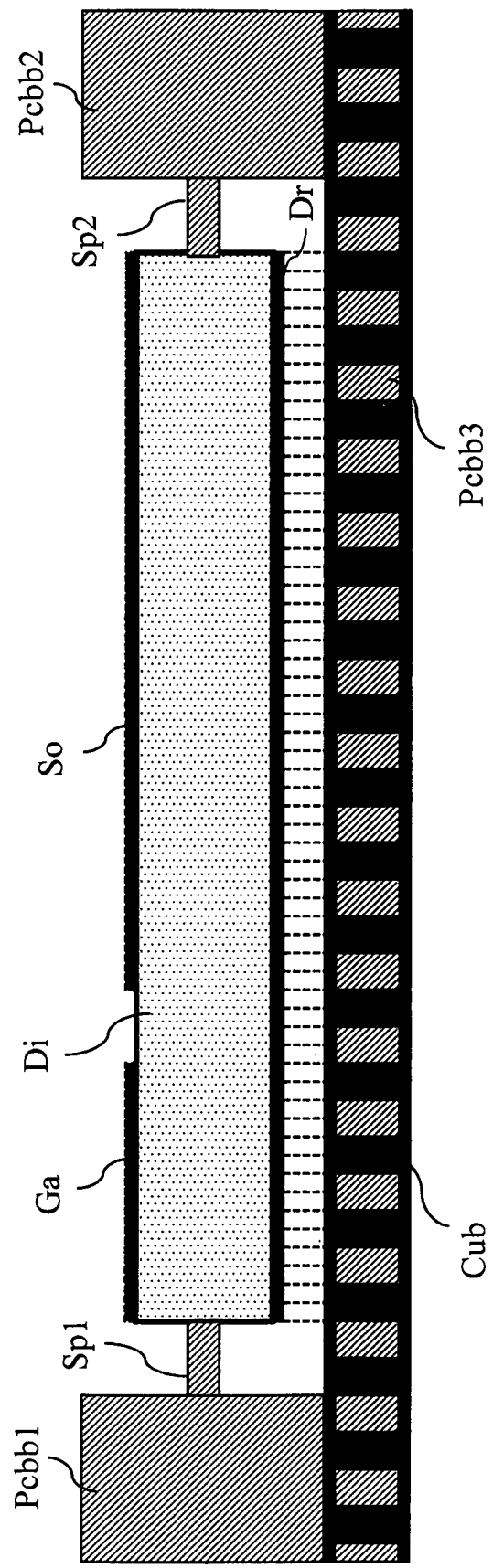
FIG. 2 represents a second step of the manufacturing of the second part of a printed circuit board that is intended to embed a power die according to the present invention.

FIG. 2 represents a second step of the manufacturing of the second part of a printed circuit board that is intended to embed a power die according to the present invention.

Once the second part of the printed circuit board is manufactured, the power die Di is placed in the cavity formed by the printed circuit boards Pcbb1 to Pcbb3. The location of the power die Di is determined by the spacers Sp1 and Sp2. The power die Di includes a first surface having a drain Dr, and a second surface, opposite the first surface, having a gate (Ga) portion and a source (So) portion.

The nano wires disposed on the copper layer Cub are in contact with the drain Dr of the power die Di.

In order to allow a high electrical and thermal conductivity and to prevent flattening of the nano wires during the assembly, the drain Dr surface may be activated for example by adding a thin layer such as solder paste that may facilitate the contact and lead to a solid connection between the nano wires and the drain Dr surface. The use of a porous surface with small patterns, e.g. scratches or nano-cavities, or the generation of short, micrometer-range copper nano-wires may facilitate the connection between the nano wires and the surface of the drain Dr.

Figure 3:
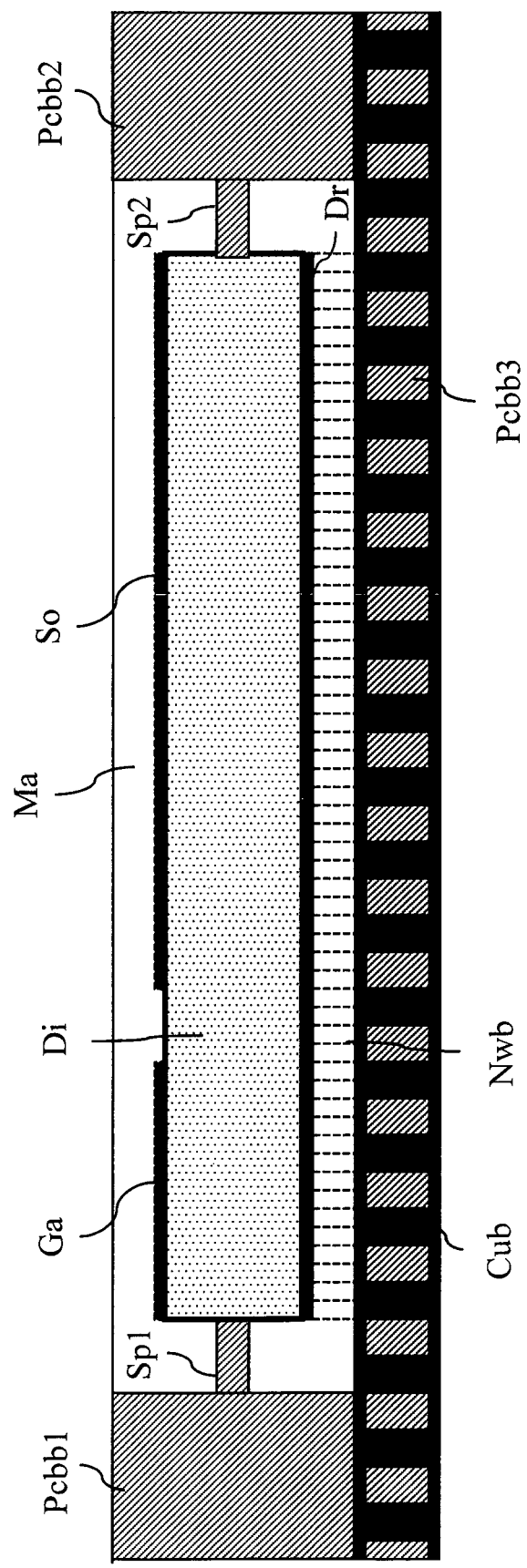
FIG. 3 represents a third step of the manufacturing of the second part of a printed circuit board that is intended to embed a power die according to the present invention.

FIG. 3 represents a third step of the manufacturing of the second part of a printed circuit board that is intended to embed a power die according to the present invention.

In the third step, the cavity formed by the printed circuit boards Pcbb1 to Pcbb3 is filled with a dielectric fluid in order to decrease the thermal resistance between die and case, thus facilitating the heat flow away from the power die Di, increase the thermal capacitance, thus limiting the temperature increase in case of surge current or short-circuits, prevent oxidation of the nano wires, prevent conglomeration of the wires together due to the joint action of heat and current and provide isolation between different electrical potentials such as gate-drain, source-drain or gate-source in the case of a MOSFET power die Di.

The dielectric fluid may be liquid with various levels of viscosity like for example isolating silicone gel/grease, dielectric oil. The dielectric fluid has a low viscosity during cavity filling to allow the fluid to fill properly the volume of the cavity, especially between the nano wires. After the cavity filling, the viscosity may increase, for example to provide a gel-like viscosity. The fluid may also be a two-phase material like for example paraffin or other wax-like substance with a melting point chosen either sufficiently low like for example 42° C. so that it is liquid during nominal operation, or higher like for example 200° C. so that the dielectric fluid melts only during abnormal operation like surge currents or short-circuits. Thus, the transition energy is used to stabilize the temperature during surge currents and thus increases the robustness of the power die Di.

The cavity may be filled during the assembly process as described previously, but alternatively, the cavity may be filled afterwards as it will be disclosed hereinafter.

An additional step of mechanical agitation, for example using ultrasound bath, might be used before sealing in order to improve the fluid penetration within the available space in the nano-wire forest.

Figure 4:
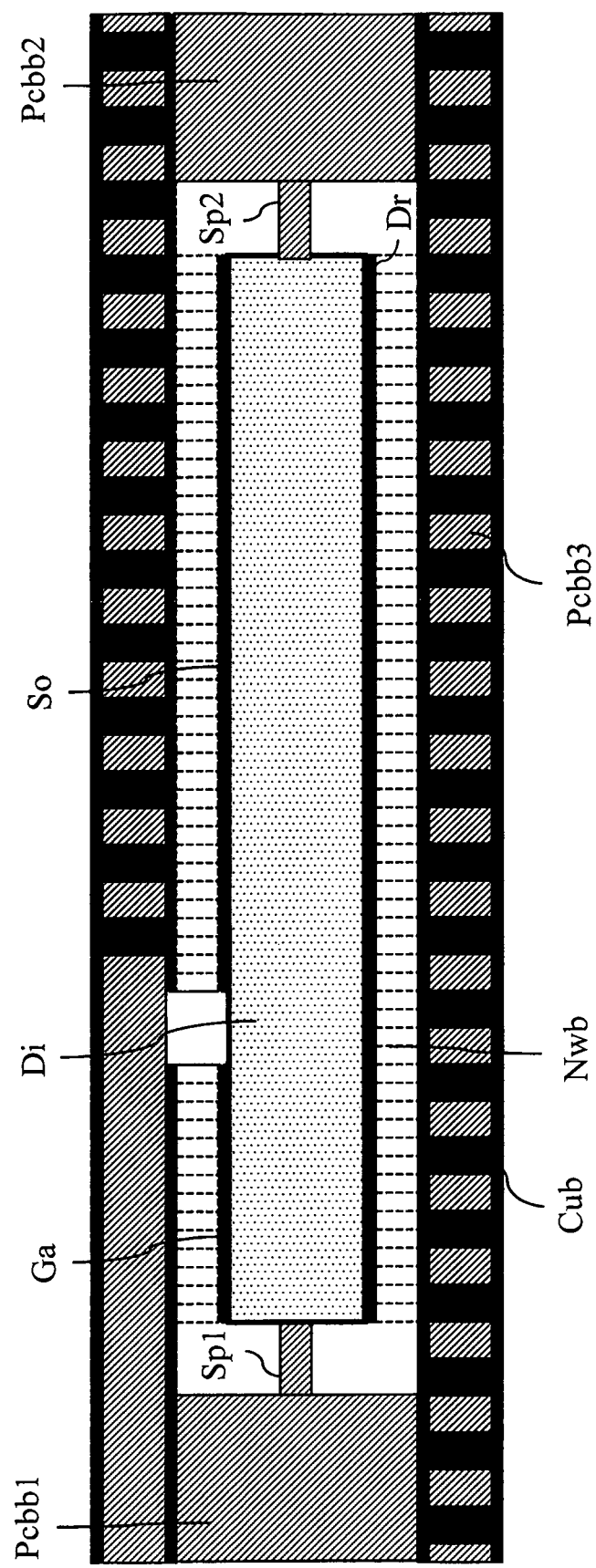
FIG. 4 represents the printed circuit board that embeds a power die according to the present invention.

FIG. 4 represents the printed circuit board that embeds a power die according to the present invention.

The printed circuit board is formed by the assembly of the first and second parts of the printed circuit board in order to form a press-pack type connection i.e. where the power die Di is sandwiched between two copper surfaces with the only effect of pressure. The pressure is first applied during a lamination process, but a residual pressure is present that holds the power die in position after the assembly process.

One example of process is described in FIG. 4 where the nano wires are created on a printed circuit board core with thermal vias. Previously milled prepreg layers are laminated to the core with previously created nano wires.

Figure 5:
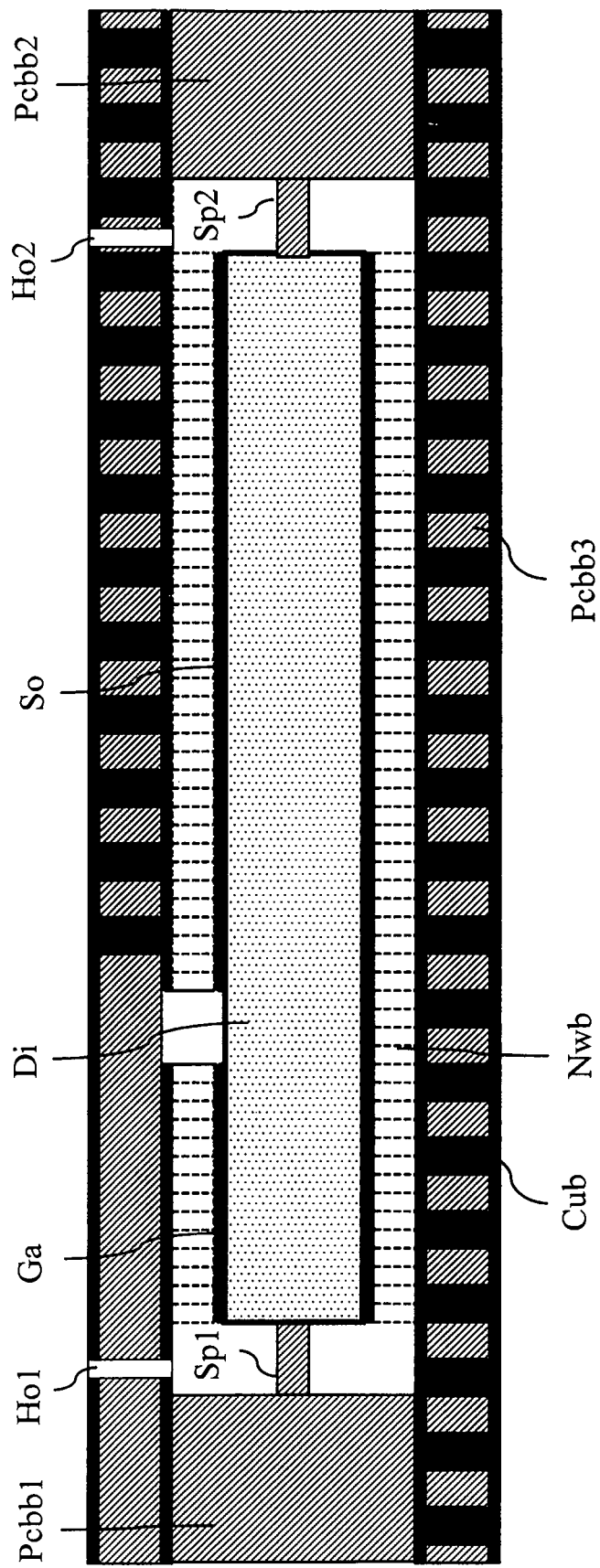
FIG. 5 represents an example of a first variant of a printed circuit board that embeds a power die according to the present invention.

FIG. 5 represents an example of a first variant of a printed circuit board that embeds a power die according to the present invention.

In the example of FIG. 5, the first part of the printed circuit board comprises two holes noted Ho1 and Ho2 that enable the filling of the cavity formed by the printed circuit boards Pcbb1 to Pcbb3 with the dielectric fluid after the assembly of the first and second parts of the printed circuit board.

Once the cavity formed by the printed circuit boards Pcbb1 to Pcbb3 is filled with the dielectric fluid, the holes Ho1 and Ho2 are filled up with a resin not shown in FIG. 5.

Figure 6:
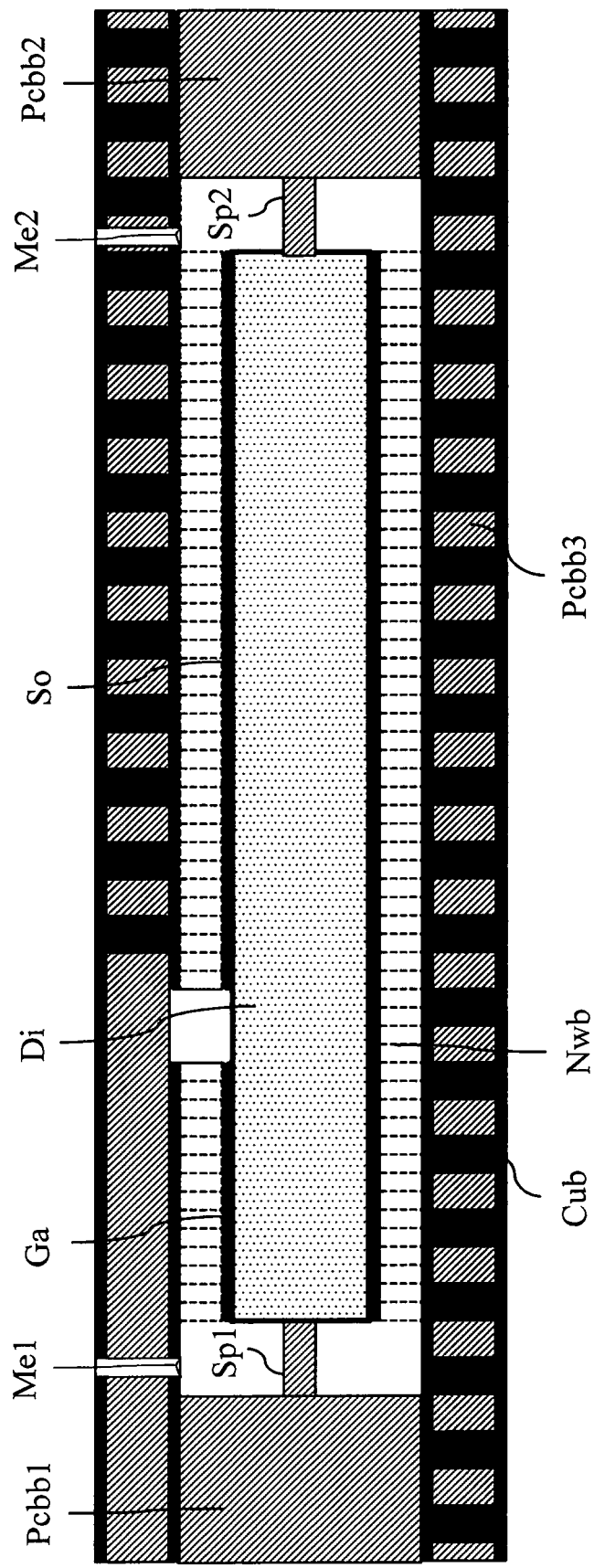
FIG. 6 represents an example of a second variant of a printed circuit board that embeds a power die according to the present invention.

FIG. 6 represents an example of a second variant of a printed circuit board that embeds a power die according to the present invention.

In the example of FIG. 6, the first part of the printed circuit board comprises two membranes noted Me1 and Me2. Membranes act as expansion valves. The membranes Me1 and Me2 are for example flexible membranes so that they can deform if the dielectric fluid expands or shrinks with temperature and/or phase change.

Figure 7:
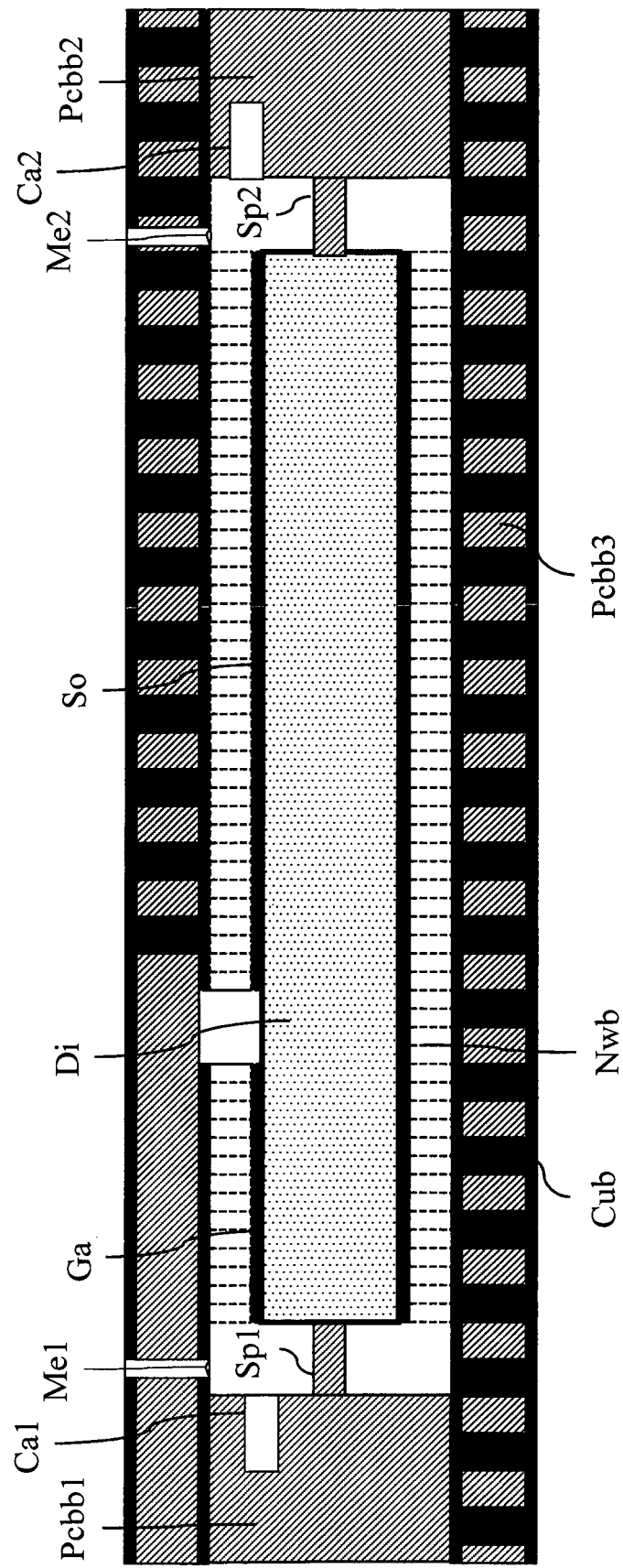
FIG. 7 represents an example of a third variant of a printed circuit board that embeds a power die according to the present invention.

FIG. 7 represents an example of a third variant of a printed circuit board that embeds a power die according to the present invention. In the example of FIG. 7, the printed circuit boards Pcbb1 and Pcbb2 comprise cavities Ca1 and Ca2 that may be used to allow the dielectric fluid to expand and shrink in and out of the cavities Ca1 and Ca2.

Figure 8:
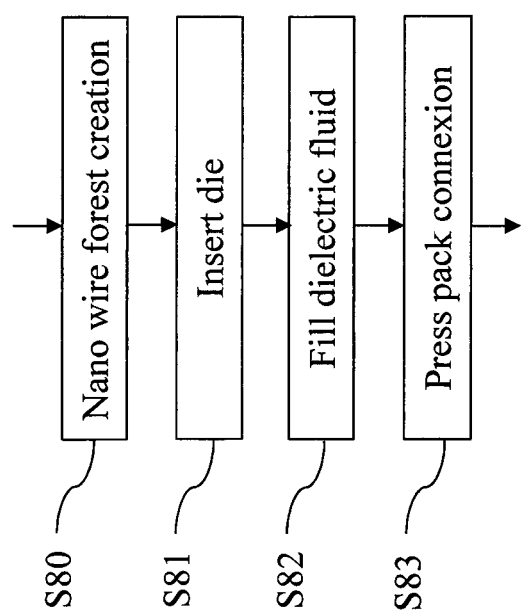
FIG. 8 represents an example of an algorithm for manufacturing a printed circuit board that embeds a power die according to the present invention.

FIG. 8 represents an example of an algorithm for manufacturing a printed circuit board that embeds a power die according to the present invention.

At step S80, nano wires are created on parts of the copper layer Cua of the first part of the printed circuit board and on the copper layer Cub of the second part of the printed circuit board.

Alternatively, the nano wires are created on the power die itself. For example, nano wires are formed by attaching/growing a porous alumina layer to the copper surface, copper electroplating, and selectively etching the layer.

The formed nano wires are typically wires with length in the order of 10 μm and diameter in the order of 100 nm. The ratio between length and diameter is typically higher than 10. The nano wires are sufficiently numerous, for example at least one million per cm2 and may cover more than 50% of the treated surface to provide a high cumulative cross-section. The nano wires are processed in order to obtain consistent heights, thus facilitating a homogeneous contact with the surface of the power die. This can be done for example by a polishing step prior to porous layer etching.

In order to prevent adhesion of the wires together due to the joint action of heat and current, a step of surface coating may be added.

For example, a coating layer of non-bondable material may be deposited on the external surface of the nano wires by deposition techniques such as chemical vapor deposition, electroless of electrolytic deposition, or a combination of the above mentioned techniques.

At step S81, the power die Di is placed in the cavity formed by the printed circuit boards Pcbb1 to Pcbb3 of the second part of the printed circuit board. The location of the power die Di is determined by the spacers Sp1 and Sp2.

The nano wires disposed on the copper layer Cub are typically in contact with the drain Dr of the power die Di.

In order to allow a high electrical and thermal conductivity and to prevent flattening of the nano wires during the assembly, the drain Dr surface may be activated for example by adding a thin layer such as solder paste that may facilitate the contact and lead to a solid connection between the nano wires and the drain Dr surface. The use of a porous surface with small patterns, e.g. scratches or nano-cavities, or the generation of short, micrometer-range copper nano-wires may facilitate the connection between the nano wires and the surface of the drain Dr.

At step S82, the cavity formed by the printed circuit boards Pcbb1 to Pcbb3 is filled with a dielectric fluid in order to decrease the thermal resistance between die and case, thus facilitating the heat flow away from the power die Di, increase the thermal capacitance, thus limiting the temperature increase in case of surge current or short-circuits, prevent oxidation of the nano wires, prevent conglomeration of the wires together due to the joint action of heat and current and provide isolation between different electrical potentials such as gate-drain, source-drain or gate-source in the case of a MOSFET power die Di.

The dielectric fluid may be liquid with various levels of viscosity like for example isolating silicone gel/grease, dielectric oil. The dielectric fluid as a low viscosity during cavity filling to allow the fluid to fill properly the volume of the cavity, especially between the nano wires. After the cavity filling, the viscosity may increase, for example to provide a gel-like viscosity. The fluid may also be a two-phase material like for example paraffin or other wax like substance with a melting point chosen either sufficiently low like for example 42° C. so that it is liquid during nominal operation, or higher like for example 200° C., so that the dielectric fluid melts only during abnormal operation like surge, currents or short-circuits. Thus, the transition energy is used to stabilize the temperature during surge currents and thus increases the robustness of the power die Di.

The cavity may be filled during the assembly process as previously described, but alternatively, the cavity may be filled afterwards as it will be disclosed hereinafter.

An additional step of mechanical agitation, for example using ultrasound bath, might be used before sealing in order to improve the fluid penetration within the available space in the nano-wire forest.

At next step S83, the printed circuit board is formed by the assembly of the first and second parts of the printed circuit board in order to form a press-pack type connection i.e. where the power die Di is sandwiched between two copper surfaces with the only effect of pressure. The pressure is first applied during a lamination process, but a residual pressure is present that holds the power die in position after the assembly process.

It has to be noted here, as disclosed in reference to FIG. 5 or 6 or 7, that the step S83 maybe performed before the step S82.

Figure 9:
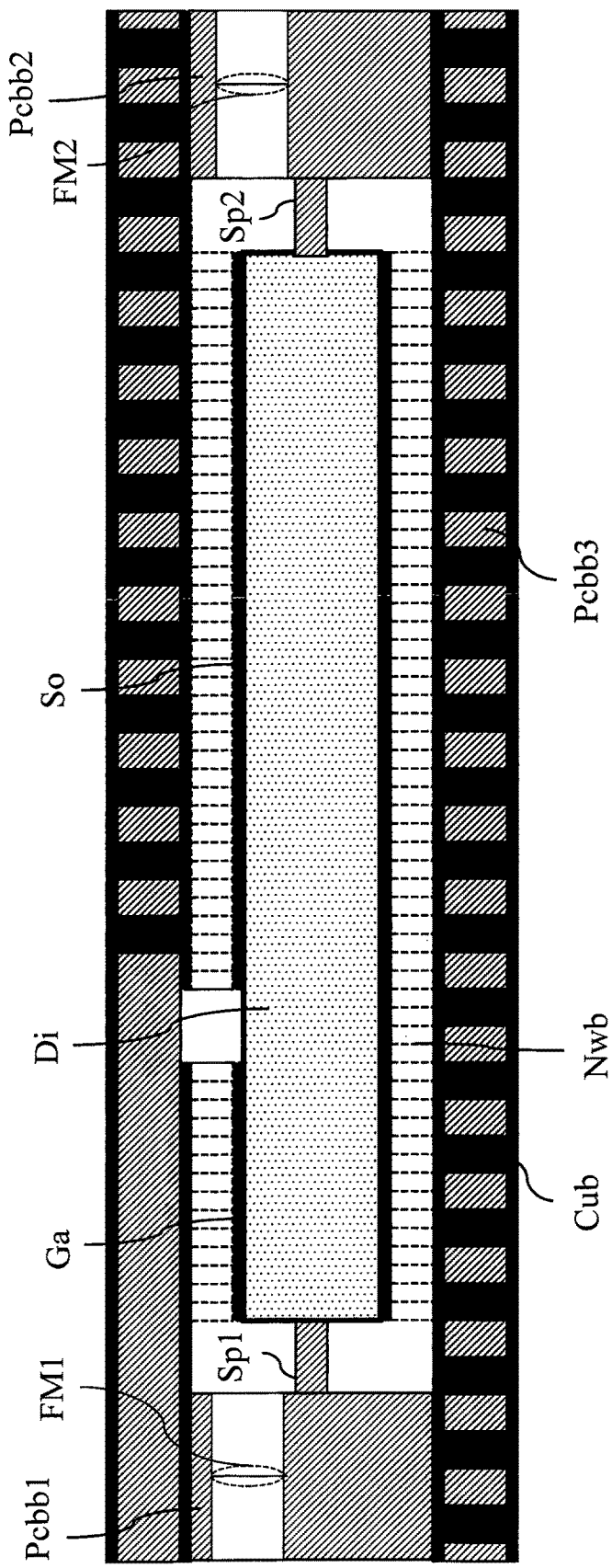
FIG. 9 represents an example of a fourth variant of a printed circuit board that embeds a power die according to the present invention.

FIG. 9 represents an example of a fourth variant of a printed circuit board that embeds a power die according to the present invention.

In the fourth variant, the printed circuit boards Pcbb1 and Pcbb2 comprise respectively flexible membranes FM1 and FM2 that deform when the fluid expands or shrinks with temperature and/or phase change of the fluid.

The membranes FM1 and FM2 are for example flexible membranes so that they can deform if the dielectric fluid expands or shrinks with temperature and/or phase change. The membranes are typically composed of a flexible but impermeable material such as polyimide that is locally laminated in the printed circuit board assembly.

It has to be noted here that the flexible membranes may also be located in the printed circuit boards Pcba and Pcbb3.

Naturally, many modifications can be made to the embodiments of the invention described above without departing from the scope of the present invention.

The invention claimed is:

1. A printed circuit board embedding a power die wherein interconnections between the power die and the printed circuit board are composed of micro/nano wires, the printed circuit board comprising a cavity wherein the power die is placed,
the cavity is further filled with a dielectric fluid or an isolating silicone gel or grease or a dielectric oil, characterized in that
the printed circuit board further comprises flexible membranes that deform when the fluid expands or shrinks with temperature and/or phase change of the fluid or the printed circuit board further comprises holes that enable the filling of the dielectric fluid within the cavity and the holes are closed with flexible membranes after the filling of the dielectric fluid within the cavity.

2. The printed circuit board according to claim 1, characterized in that the dielectric fluid has a low viscosity during cavity filling to allow the fluid to fill properly the volume of the cavity and between the nano wires.

3. The printed circuit board according to claim 1, characterized in that the dielectric fluid is a two-phase material.

4. The printed circuit board according to claim 1, characterized in that the printed circuit board further comprises at least one other cavity for enabling the dielectric fluid to shrink in and out of the at least one other cavity.

5. The printed circuit board according to claim 2, characterized in that the printed circuit board further comprises at least one other cavity for enabling the dielectric fluid to shrink in and out of the at least one other cavity.

6. The printed circuit board according to claim 3, characterized in that the printed circuit board further comprises at least one other cavity for enabling the dielectric fluid to shrink in and out of the at least one other cavity.

7. The printed circuit board according to claim 1, characterized in that the holes are filled with a resin after the filling of the dielectric fluid within the cavity.

8. The printed circuit board according to claim 2, characterized in that the holes are filled with a resin after the filling of the dielectric fluid within the cavity.

9. The printed circuit board according to claim 3, characterized in that the holes are filled with a resin after the filling of the dielectric fluid within the cavity.

10. The printed circuit board according to claim 4, characterized in that the holes are filled with a resin after the filling of the dielectric fluid within the cavity.

11. The printed circuit board according to claim 5, characterized in that the holes are filled with a resin after the filling of the dielectric fluid within the cavity.

12. The printed circuit board according to claim 6, characterized in the holes are filled with a resin after the filling of the dielectric fluid within the cavity.

13. A method for manufacturing a printed circuit board embedding a power die wherein interconnections between the power die and the printed circuit board are composed of micro/nano wires, the printed circuit board comprising a cavity wherein the power die is placed, characterized in that the method comprises the step of filling the cavity with a dielectric fluid or with an isolating silicone gel or with grease or with a dielectric oil, and in that the printed circuit board further comprises flexible membranes that deform when the fluid expands or shrinks with temperature and/or phase change of the fluid or the printed circuit board further comprises holes that enable the filling of the dielectric fluid within the cavity and the holes are closed with flexible membranes after the filling of the dielectric fluid within the cavity.

* * * * *